United States Patent
Agraharam et al.

(10) Patent No.: US 6,989,586 B2
(45) Date of Patent: Jan. 24, 2006

(54) INTEGRATED CIRCUIT PACKAGES WITH REDUCED STRESS ON DIE AND ASSOCIATED SUBSTRATES, ASSEMBLIES, AND SYSTEMS

(75) Inventors: Sairam Agraharam, Phoenix, AZ (US); Carlton Hanna, Chandler, AZ (US); Vasudeva Atluri, Scottsdale, AZ (US); Dongming He, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/403,313

(22) Filed: Mar. 31, 2003

(65) Prior Publication Data

US 2004/0188813 A1 Sep. 30, 2004

(51) Int. Cl.
*H01L 23/02* (2006.01)

(52) U.S. Cl. .................. 257/678; 257/778; 257/779
(58) Field of Classification Search ......... 257/666–678, 257/690, 698, 700–703, 778, 779
See application file for complete search history.

(56) References Cited

U.S. PATENT DOCUMENTS 6,201,707 B1 * 3/2001 Sota .......................... 361/761

| 6,571,245 B2 * | 5/2003 | Huang et al. ................ 707/10 |
| 2003/0034565 A1 * | 2/2003 | Lan et al. .................. 257/778 |
| 2003/0157747 A1 * | 8/2003 | Chen et al. ................. 438/106 |

OTHER PUBLICATIONS

Harper, Electronic Packaging Interconnection Handbook, 1991, McGraw–Hill, 5.1–5.5.*
Wolf et al., Silicon Processing for the VLSI Era, 2000, vol. I, Lattice Press, 719–727, 791–795.*

* cited by examiner

*Primary Examiner*—Leonardo Andujar
(74) *Attorney, Agent, or Firm*—Schwegman, Lunberg, Woessner & Kluth, P.A.

(57) ABSTRACT

Mechanical stresses are reduced between an electronic component having relatively low fracture toughness and a substrate having relatively greater fracture toughness. In an embodiment, the component may be a die having mounting contacts formed of a low yield strength material, such as solder. A package substrate has columnar lands formed of a relatively higher yield strength material, such as copper, having a relatively higher melting point than the component contacts and having a relatively high current-carrying capacity. The component contacts may be hemispherical in shape. The lands may be substantially cylinders, truncated cones or pyramids, inverted truncated cones or pyramids, or other columnar shapes. Methods of fabrication, as well as application of the package to an electronic assembly and to an electronic system, are also described.

38 Claims, 4 Drawing Sheets

INTEGRATED CIRCUIT PACKAGES WITH REDUCED STRESS ON DIE AND ASSOCIATED SUBSTRATES, ASSEMBLIES, AND SYSTEMS

TECHNICAL FIELD

The subject matter relates generally to electronics packaging and, more particularly, to an electronics package with reduced mechanical stresses between a component and a substrate on which the component is mounted, and to manufacturing methods related thereto.

BACKGROUND INFORMATION

An integrated circuit ("IC") die may be assembled into an IC package by physically and electrically coupling it to a substrate made of organic or ceramic material. One or more IC packages may be physically and electrically coupled to a printed circuit board ("PCB") to form an "electronic assembly". The "electronic assembly" may be part of an "electronic system". An "electronic system" is broadly defined herein as any product comprising an "electronic assembly". Examples of electronic systems include computers (e.g., server, router, desktop, laptop, hand-held, Web appliance, etc.), wireless communications devices (e.g., cellular phone, cordless phone, pager, etc.), computer-related peripherals (e.g., printer, scanner, monitor, etc.), entertainment devices (e.g., television, radio, stereo, tape and compact disc players, video cassette recorder, camcorder, digital camera, MP3 (Motion Picture Experts Group, Audio Layer 3) player, etc.), and the like.

An IC die may comprise one or more active and/or passive circuits. At least one surface of the die may comprise a number of pads or contacts to couple the die functionally to another element, such as an IC substrate. To operate at relatively high clock frequencies, some dice may contain dielectric material having a relatively low dielectric constant ("K"), for example, less than 3.6. Such dielectric materials may be structurally relatively weak and may have relatively low fracture toughness.

An IC substrate may comprise a number of layers. Some layers may comprise organic or ceramic dielectric material. Some layers may comprise conductors, such as traces, ground planes, and vias. An IC substrate may include an electronic component mounted on a surface of the substrate. The electronic component may be functionally connected to other elements of an electronic system through a hierarchy of conductors that include the substrate traces, ground planes, and vias. The conductors may carry signals that are transmitted among the electronic components, such as IC's, of the system. An IC substrate may have a relatively large number of input/output ("I/O") terminals (also called "lands"), as well as a large number of power and ground terminals or lands, on a surface of the IC substrate.

In the field of electronics there is competitive pressure among manufacturers to drive the performance of their equipment up while driving down production costs and maintaining acceptable yield and reliability. This is particularly true regarding the packaging of dice on substrates, where each new generation of packaging must provide increased performance, particularly in terms of higher clock frequencies, while generally being smaller or more compact in size.

In known IC packages in which the contacts of a die having one or more low-K dielectric layers are electrically and mechanically coupled to corresponding lands of an IC substrate, the yield and reliability may diminish to unacceptable levels.

For the reasons stated above, and for other reasons stated below which will become apparent to those skilled in the art upon reading and understanding this disclosure, there is a significant need in the art for apparatus and methods for packaging a die on a substrate that minimize yield and reliability problems associated with dice containing low-K dielectric materials.

DETAILED DESCRIPTION

In the following detailed description of embodiments of the subject matter, reference is made to the accompanying drawings, which form a part hereof, and in which is shown by way of illustration specific preferred embodiments in which the subject matter may be practiced. These embodiments are described in sufficient detail to enable those skilled in the art to practice the subject matter, and it is to be understood that other embodiments may be utilized and that structural, mechanical, compositional, electrical, and procedural changes may be made without departing from the spirit and scope of the subject matter. The following detailed description is, therefore, not to be taken in a limiting sense, and the scope of the subject matter is defined only by the appended claims.

The subject matter provides a solution to certain mechanical stress problems that are associated with prior art packaging of integrated circuits. In an embodiment, the component is a die having mounting pads or contacts formed of a low yield strength material, such as solder. A package substrate has mounting terminals or lands formed of a relatively higher yield strength material, such as copper, having a relatively high current-carrying capacity. The solder contacts may be hemispherical in shape, and the lands may be columnar in shape, such as cylinders, truncated cones or pyramids, inverted truncated cones or pyramids, or the like. Various embodiments are illustrated and described herein, including methods of fabrication, as well as application of the package to an electronic assembly and to an electronic system.

Figure 1:
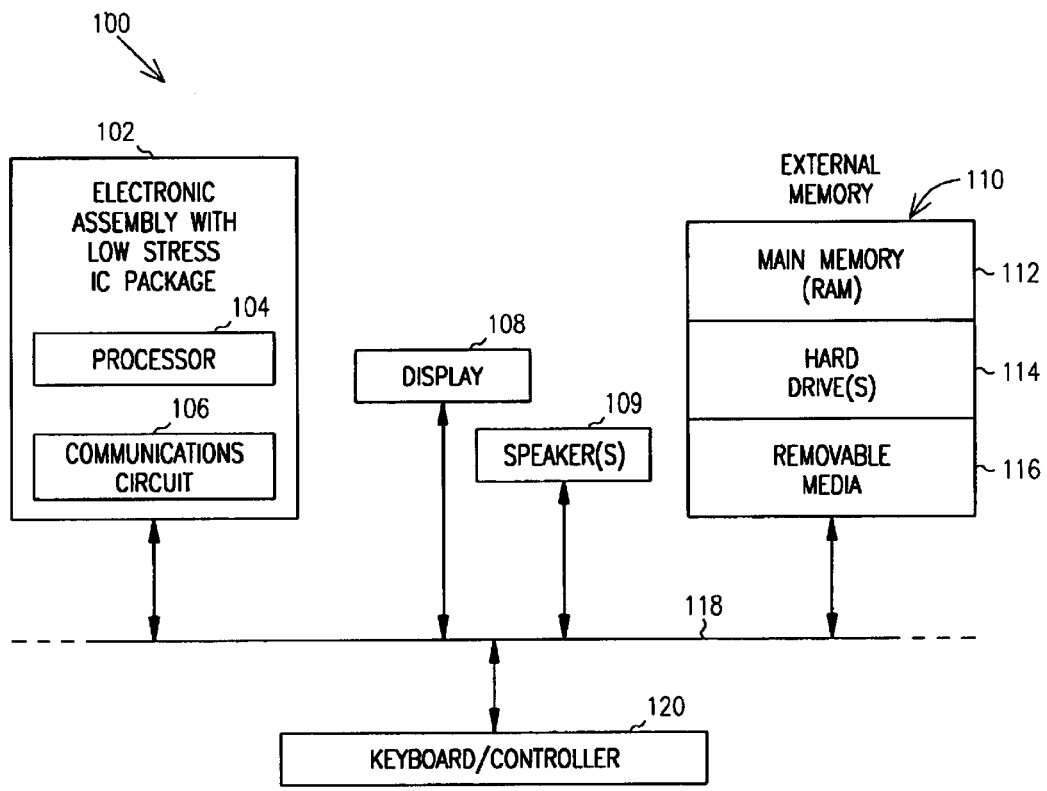
FIG. 1 is a block diagram of an electronic system incorporating at least one electronic assembly with a low stress IC package, in accordance with an embodiment of the subject matter.

FIG. 1 is a block diagram of an electronic system 100 incorporating at least one electronic assembly 102 with a low stress IC package, in accordance with an embodiment of the subject matter. Electronic system 100 is merely one example of an electronic system in which the subject matter may be used. In this example, electronic system 100 comprises a data processing system that includes a system bus 118 to couple various components of the system. System bus 118 provides communications links among various components of the electronic system 100 and may be implemented as a single bus, as a combination of busses, or in any other suitable manner.

"Suitable", as used herein, means having characteristics that are sufficient to produce the desired result(s). Suitability for the intended purpose can be determined by one of ordinary skill in the art using only routine experimentation.

Electronic assembly 102 is coupled to system bus 118. Electronic assembly 102 may include any circuit or combination of circuits. In one embodiment, electronic assembly 102 includes a processor 104 which may be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that may be included in electronic assembly 102 are a custom circuit, an application-specific integrated circuit (ASIC), or the like, such as, for example, one or more circuits (such as a communications circuit 106) for use in wireless devices like cellular telephones, pagers, portable computers, personal-digital assistants, two-way radios, and similar electronic systems. The IC may perform any other type of function.

Electronic system 100 may also include an external memory 110, which in turn may include one or more memory elements suitable to the particular application, such as a main memory 112 in the form of random access memory (RAM), one or more hard drives 114, and/or one or more drives that handle removable media 116 such as floppy diskettes, compact disks (CDs), digital video disks (DVD), and the like.

Electronic system 100 may also include a display device 108, one or more speakers 109, and a keyboard and/or controller 120, which may include a mouse, trackball, game controller, voice-recognition device, or any other device that may permit a system user to input information into and receive information from the electronic system 100.

An electronic system 100 and/or data processing system that incorporates one or more electronic assemblies 102 that utilize an embodiment of the subject matter may reduce mechanical stresses associated with high performance IC's, and such systems may therefore be more commercially attractive than other systems.

Figure 2:
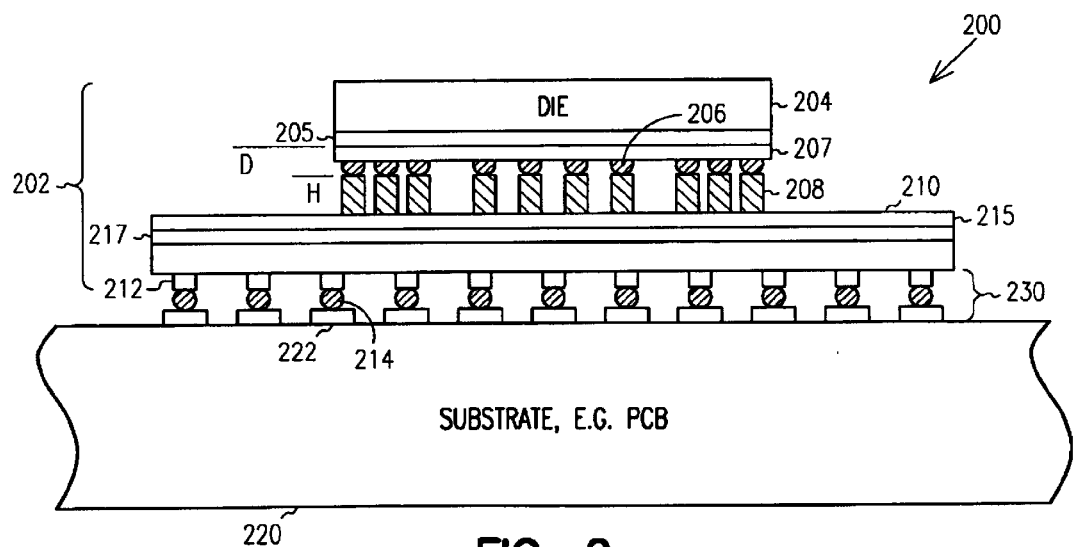
FIG. 2 illustrates a cross-sectional representation of an electronic assembly comprising a low stress IC package, in accordance with an embodiment of the subject matter.

FIG. 2 illustrates a cross-sectional representation of an electronic assembly 200 comprising a low stress IC package 202, in accordance with an embodiment of the subject matter.

IC package 202 includes a IC die 204 mounted in "flip-chip" orientation with its pads or contacts 206 facing downward to couple with corresponding columns or lands 208 on the upper surface of a substrate 210. In the embodiment shown, substrate 210 may be an IC package substrate. A suitable underfill (not shown), such as an epoxy material or a polyimide, may be used to surround the contact/land interconnections between die 204 and substrate 210 to provide mechanical stability and strength. For example, the underfill may be a pre-applied underfill, a capillary underfill, or a no-flow underfill.

Substrate 210 may be coupled to an additional substrate, such as a PCB 220, a motherboard, a mezzanine board, or the like. Substrate 220 may be a one-layer board or a multi-layer board, and it may include additional lands (not shown) on its opposite surface for mating with additional packaging structure (not shown). Substrate 210 may be coupled to PCB 220 through pads 212 on the lower surface of substrate 210, solder balls or bumps 214, and corresponding lands 222 on the upper surface of PCB 220. Pads 212, solder balls 214, and lands 222 may be part of a ball grid array ("BGA") structure 230.

Referring again to die 204, the die 204 may be of any type. In an embodiment, die 204 comprises a processor. Die 204 may comprise one or more dielectric layers, such as dielectric layers 205 and 207. Dielectric layers 205 and 207 may be formed of dielectric material having a relatively low dielectric constant ("K"), for example, less than 3.6. Such dielectric materials may be structurally relatively weak and may have relatively low fracture toughness. However, such low-K dielectric materials may provide faster performance of the internal circuitry of die 204 than if higher K dielectric materials were used. For example, low-K dielectric materials may reduce capacitance and cross-talk within the die and within the IC package.

In an embodiment, contacts 206 of die 204 may be formed of material having a relatively low yield strength, compared with the material in lands 208. For example, contacts 206 may comprise solder. The solder may be a lead-free solder, such as tin-silver, tin-copper, or tin-silver-copper. The solder may also be a lead-bearing solder, such as a eutectic tin-lead solder of approximately 63% tin and 37% lead. However, the specific proportions of tin and lead are not critical, and different proportions may be used. In addition, many different alloys may be used. In an embodiment, contacts 206 are formed of a high lead content solder. In general, the solder may be formed of material selected from the group consisting essentially of antimony, bismuth, copper, gallium, gold, indium, lead, nickel, silver, tin, zinc, or alloys thereof.

The term "essentially", as used herein, means more than a trace amount, i.e. more than 2% by weight.

In an embodiment, contacts 206 of die 204 may have a hemispherical shape; however, other shapes are also possible, including those mentioned herein as applicable to columns or lands 208.

In order for contacts 206 to reflow, when subjected to suitable heat, for example in a reflow oven, and to be physically connected to lands 208 projecting from the upper surface of substrate 210, without lands 208 concurrently inciting, the melting temperature of the material in contacts 206 is lower than the melting temperature of the material in lands 208. In an embodiment, the melting point of contacts 206 is more than 100 degrees Centigrade below that of lands 208.

Referring now to substrate 210, substrate 210 may be of any suitable type, and it may comprise ceramic and/or organic dielectric materials. In an embodiment, substrate 210 comprises organic dielectric materials. Such organic dielectric materials may be relatively flexible and have a relatively high modulus of elasticity.

Substrate 210 may comprise one or more dielectric layers, such as dielectric layers 215 and 217. Substrate 210 may also comprise a number of conductors (not shown), such as traces, ground planes, and vias of any type. The conductors may be for signals, for power, and for ground. Various conductors may be formed in one or more layers within or between dielectric layers.

Substrate 210 includes a plurality of lands 208. Lands 208 may be formed of material having a relatively high melting temperature, compared with that of the material in contacts 206. In an embodiment, the melting point of lands 208 is at least 100 degrees Centigrade higher than that of contacts 207 of die 204.

The material in contacts 208 may comprise a metal or alloy. In various embodiments, lands 208 may comprise copper, nickel, or gold. In another embodiment, the material may be a high-lead solder. In general, the material in lands 208 may be formed of material selected from the group consisting essentially of antimony, bismuth, copper, gallium, gold, indium, lead, nickel, silver, tin, zinc, or alloys thereof.

In an embodiment, lands 208 may be formed of material having a relatively high yield strength, compared with the material in contacts 206. In an embodiment wherein the contacts 206 are formed of solder, and wherein the lands 208 are formed of copper, the solder contacts 206 may have nearly two orders of magnitude lower yield strength than the copper lands 208, and the solder contacts 206 will undergo plastic deformation, thus reducing package-induced mechanical stresses imparted to the low-K inter-layer dielectric material in the die 204.

If substrate 210 comprises organic dielectric materials, having a relatively high modulus of elasticity, substrate 210 may relatively easily withstand package-induced mechanical stresses caused by relatively rigid lands 208.

In an embodiment, lands 208 of substrate 210 are columns. The columns may have a cylindrical shape (FIG. 3); however, other shapes are also possible, as shown in FIGS. 4–7.

The term "column", as used herein, means a geometrical shape in which the aspect ratio between the height and the diameter (or average width) is in a range of 0.5 to 3.

With respect to the package substrate 210, bump co-planarity and bump height uniformity may be improved. Contact-to-land wetting during the process of attaching the component to the substrate may be improved. The bump height may be increased or decreased, as desired, for stress reduction. In addition, a solder reflow operation that may typically be performed during substrate fabrication, in order to smooth solder bumps on the substrate, may be eliminated. Thus, substrate warpage may be reduced through the elimination of this substrate fabrication operation. In addition, other bump-flattening operations (on the component and/or on the substrate) may also be eliminated. The elimination of one or more thermal and/or mechanical processing operations may also reduce overall stresses on the component package 202.

While the embodiment shown in FIG. 2 has been described with reference to a single IC device, embodiments of the subject matter are not limited to packaging single IC's, and they may be used for packaging multiple IC's.

Still with reference to FIG. 2, it will be seen that the lower surface of die 204 is at a gap or distance D from the upper surface of substrate 210. It will also be seen that the lands 208 have a height H, which is greater than 60% of the distance D. As mentioned above, the contact/land interconnections between the lower surface of die 204 and the upper surface of substrate 210 may be filled with an underfill.

Figure 3:
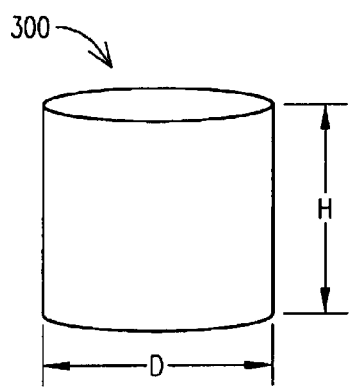
FIG. 3 illustrates a perspective representation of a substrate land shaped substantially like a cylinder, in accordance with an embodiment of the subject matter.

FIG. 3 illustrates a perspective representation of a substrate land 300 shaped substantially like a cylinder, in accordance with an embodiment of the subject matter. In the embodiment illustrated in FIG. 3, the aspect ratio between the height H and the diameter D is approximately 1.

The term "substantially", as used herein, means having some of the essential qualities of the described element. The geometry of the described element may not be perfect and may have only roughly approximate characteristics. For example, "substantially like a cylinder" means having a roughly circular or oval cross-section and a height. Thus, a column may be "substantially like a cylinder" even though it is not a perfect geometric cylinder.

Figure 4:
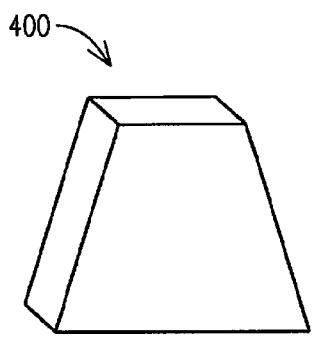
FIG. 4 illustrates a perspective representation of a substrate land shaped substantially like a truncated pyramid, in accordance with an embodiment of the subject matter.

FIG. 4 illustrates a perspective representation of a substrate land 400 shaped substantially like a truncated pyramid, in accordance with an embodiment of the subject matter.

Figure 5:
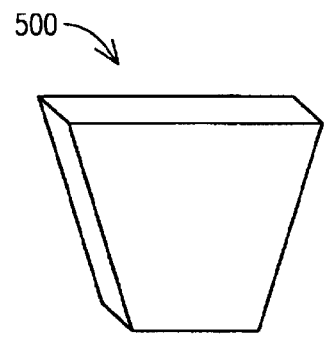
FIG. 5 illustrates a perspective representation of a substrate land shaped substantially like an inverted truncated pyramid, in accordance with an embodiment of the subject matter.

FIG. 5 illustrates a perspective representation of a substrate land 500 shaped substantially like an inverted truncated pyramid, in accordance with an embodiment of the subject matter.

Figure 6:
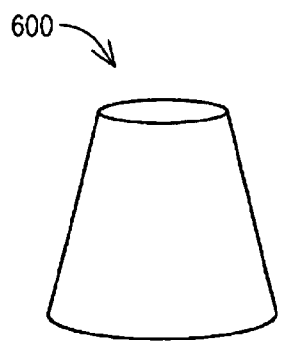
FIG. 6 illustrates a perspective representation of a substrate land shaped substantially like a truncated cone, in accordance with an embodiment of the subject matter.

FIG. 6 illustrates a perspective representation of a substrate land 600 shaped substantially like a truncated cone, in accordance with an embodiment of the subject matter.

Figure 7:
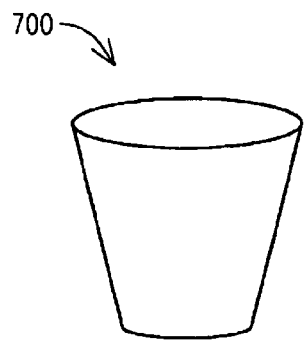
FIG. 7 illustrates a perspective representation of a substrate land shaped substantially like an inverted truncated cone, in accordance with an embodiment of the subject matter.

FIG. 7 illustrates a perspective representation of a substrate land 700 shaped substantially like an inverted truncated cone, in accordance with an embodiment of the subject matter.

Although lands 300–700 appear to be perfect geometrical solids, they need not be perfectly shaped to provide adequate function. The actual shapes of lands 300–700 within commercial embodiments of the subject matter may only roughly approximate those shown in FIGS. 3–7.

In addition to the columnar shapes illustrated in FIGS. 3–7, any other suitable columnar shapes could also be utilized, such as an hourglass (narrow-waisted), barrel (wide-waisted), cube, an N-sided solid (e.g. solid triangular column, solid pentagonal column, etc.), and any combination of the shapes herein described.

The fabrication of an IC package having reduced package-induced mechanical stresses between a component, such as a die, and a substrate will now be described.

Figure 8:
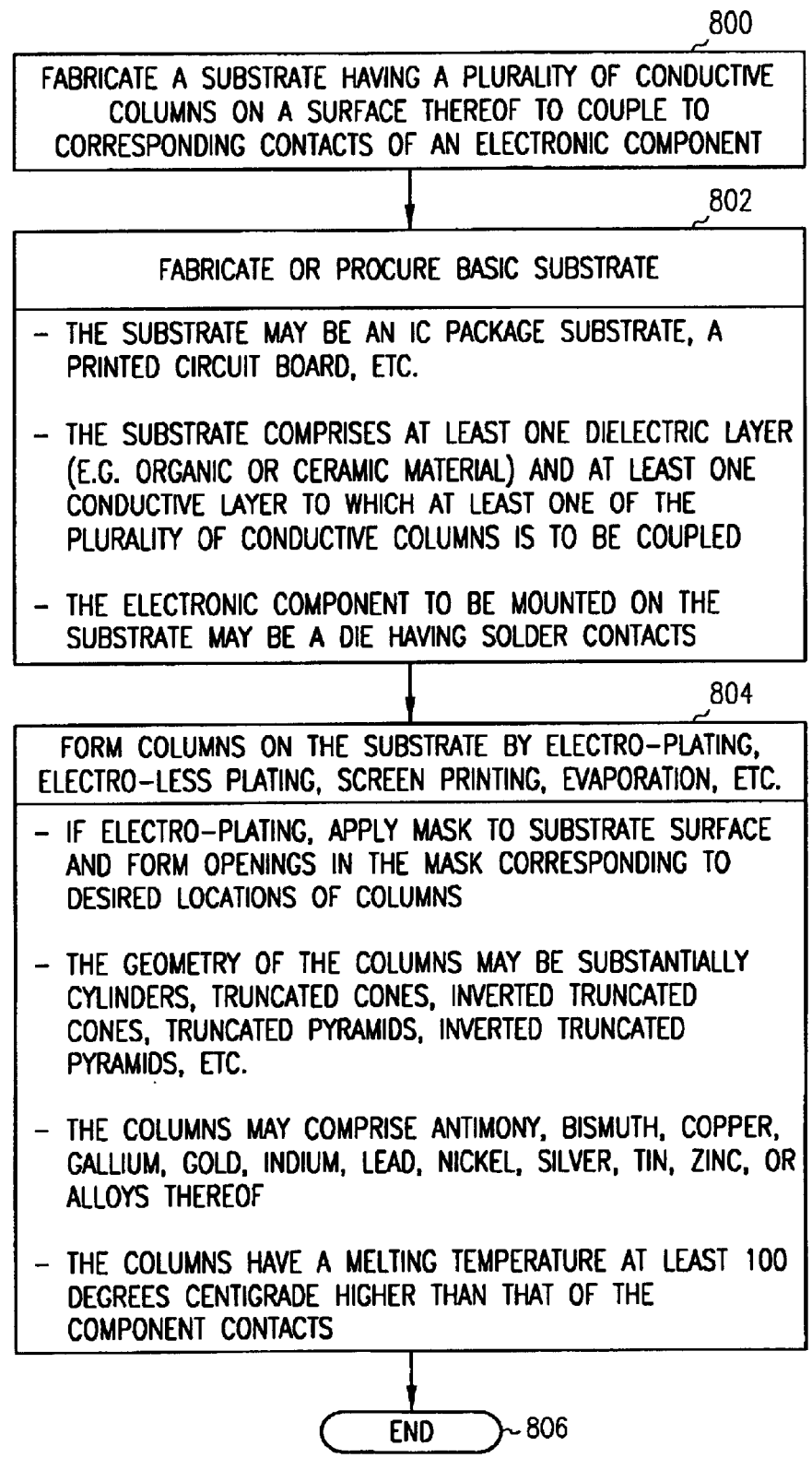
FIG. 8 is a flow diagram of several alternative methods of fabricating a substrate having a plurality of conductive columns on a surface thereof to couple to corresponding contacts of an electrical component, in accordance with various embodiments of the subject matter.

FIG. 8 is a flow diagram 800 of several alternative methods of fabricating a substrate having a plurality of conductive columns on a surface thereof to couple to corresponding contacts of an electrical component, in accordance with various embodiments of the subject matter. The substrate may be similar to or identical to substrate 210 of FIG. 2.

In 802, a basic substrate is fabricated or procured. The substrate may be an IC package substrate. Alternatively, it could be a PCB or other type of substrate. The substrate may comprise at least one dielectric layer (e.g. of organic or ceramic material). The substrate may also comprise at least one conductive layer having at least one conductive node or terminal, either on the surface of the substrate or internally within the substrate. In an embodiment, the substrate may comprise a large number of signal, power, and ground nodes.

In an embodiment, at least one of a plurality of conductive columns may be coupled to one of the conductive nodes, as described below regarding 804. In an embodiment, a plurality of columns may be coupled to a corresponding plurality of conductive nodes.

Still referring to 802, the substrate is to eventually have an electronic component mounted thereon. In an embodiment, the electronic component may be a die. The die may have a plurality of mounting contacts, which may also be referred to as "bumps" or "pads". The contacts may be formed of any suitable material, such as solder.

In 804, a plurality of conductive columns are formed on a surface of the substrate. The conductive columns may be formed using any suitable process, such as electro-plating, electro-less plating, screen printing, evaporation, or the like. The selection of a particular process depends upon the design (e.g. bump pitch and uniformity) and cost goals of the substrate as well as of the overall electronic assembly. For example, using electroplating may provide better bump height control than screen printing. Electro-plating may be used, for example, for forming copper columns. Screen printing may be used, for example, for forming copper or nickel columns.

If the columns are formed through an electroplating technique, a photoresist mask may be applied to the substrate surface. Appropriately shaped openings are formed in the mask corresponding to the desired locations of columns. The geometry of the columns may be any suitable shape, such as those mentioned earlier, including substantially cylinders, truncated cones, inverted truncated cones, truncated pyramids, and inverted truncated pyramids.

The columns may be formed of any suitable conductive material. For example, the columns may be formed of material selected from the group consisting essentially of antimony, bismuth, copper, gallium, gold, indium, lead, nickel, silver, tin, zinc, or alloys thereof.

The material of which the columns are formed should have a melting point high enough above the melting point of the component contact material, so that the columns do not melt when the contacts are subjected to reflow temperature. In an embodiment, the material of the columns has a melting point at least 100 degrees Centigrade higher than the melting point of the component contact material. In 806, the process ends.

Figure 9:
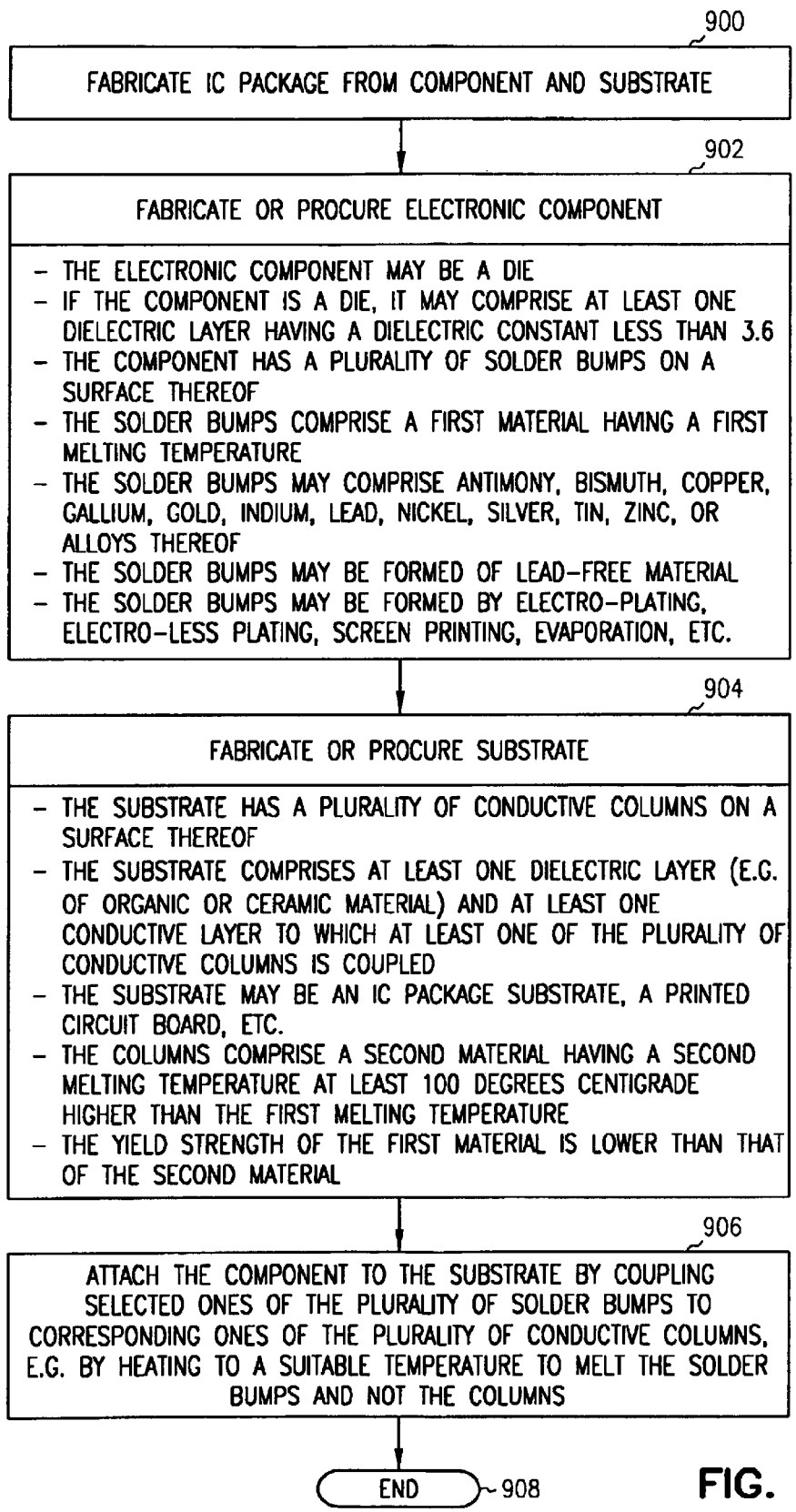
FIG. 9 is a flow diagram of several alternative methods of fabricating an IC package from a component and a substrate, in accordance with various embodiments of the subject matter.

FIG. 9 is a flow diagram 900 of several alternative methods of fabricating an IC package from a component and a substrate, in accordance with various embodiments of the subject matter.

In 902, the electronic component is fabricated or procured. In an embodiment, the component comprises a semiconductor die; however, in other embodiments it may comprise any other type of electronic component, including active and passive devices, as well as discrete components.

If the component is a semiconductor die, it may comprise at least one dielectric layer. The dielectric layer may comprise dielectric material having a relatively low dielectric constant. In various embodiments, the dielectric constant of the dielectric material is less than 3.6. Such dielectric materials may be structurally relatively weak and may have relatively low fracture toughness. However, such low-K dielectric materials may provide faster performance of the internal circuitry of the die than if higher K dielectric materials were used instead.

The component may have a plurality of mounting bumps or contacts on a surface thereof. In an embodiment, the contacts comprise solder. The contacts comprise a first material having a first melting point or temperature. In some embodiments, the contacts have a melting point in the range of 150–270 degrees Centigrade.

The contacts may be formed of any suitable conductive material. For example, the contacts may be formed of material selected from the group consisting essentially of antimony, bismuth, copper, gallium, gold, indium, lead, nickel, silver, tin, zinc, or alloys thereof. In an embodiment, the contact material may be lead-free. In another embodiment, the contact material may be lead-bearing.

In an embodiment, the contacts may have a hemispherical shape; however, other shapes are also possible. The height and volume of the contacts may be adjusted to reduce inter-layer dielectric stresses that may cause cracking and delamination, to improve the current-carrying capability of the contacts, and/or to maintain bake integrity during reflow. For example, the bump layer metallurgy and passivation opening on the die may be adjusted (e.g. increased) to enhance current-carrying capabilities, depending upon the product application.

The melting temperature of the material in the contacts is lower than the melting temperature of the material in the columns or lands of the substrate to which the component is to be mounted, as will be described below regarding 904. In an embodiment, the melting point of the contacts is more than 100 degrees Centigrade below that of the substrate columns.

The component contacts may be formed using any suitable process, such as electro-plating, electro-less plating, screen printing, evaporation, or the like. The selection of a particular process depends upon the design (e.g. bump pitch and uniformity) and cost goals of the component as well as of the overall electronic assembly. For example, using electroplating may provide better bump height control than screen printing.

In 904, the substrate is fabricated or procured. The substrate comprises a plurality of conductive columns on a surface thereof.

The substrate comprises at least one dielectric layer (e.g., of organic or ceramic material) and at least one conductive layer to which at least one of the plurality of conductive columns is coupled.

The substrate may be an IC package substrate, a PCB, or other type of substrate.

The columns comprise a second material having a second melting point or temperature. The melting temperature of the material in the columns should be higher than the melting temperature of the material in the contacts of the component to be mounted on the substrate. In an embodiment, the melting point of the columns may be more than 100 degrees Centigrade above that of the contacts. In some embodiments, the columns have a melting point in the range of 250–400 degrees Centigrade. Depending upon the fabrication process used, the temperature difference between the melting points of the materials in the columns and the contacts may be substantially less than 100 degrees Centigrade, so long as the columns do not melt when the contacts are subjected to reflow temperature.

The yield strength of the first material may be lower than that of the second material. In an embodiment, the yield strength of the first material is selected to be much lower than that of the second material. The fracture toughness of both materials may be relatively high. In an embodiment, the fracture toughness of both materials is selected to be as high as possible.

In 906, the component is attached to the substrate by coupling selected ones of the plurality of component bumps or contacts to corresponding ones of the plurality of conductive columns. This may be accomplished, for example, by heating the package components (or by providing selective heating to a subset thereof) to a suitable temperature to melt the component contacts (e.g. solder bumps) and not the substrate columns or lands. In 908, the process ends.

The operations described above with respect to the methods illustrated in FIGS. 8 and 9 may be performed in a different order from those described herein. Although the flow diagrams of FIGS. 8 and 9 show an "End", they may be performed continuously if desired.

The above-described choice of materials; geometry; number, order, dimensions, and composition of layers; fabrication operations; and assembly sequencing may all be varied by one of ordinary skill in the art to optimize the performance characteristics of the package.

Any suitable method, or combination of different methods, for forming the metal contacts and columns may be used, such as plating, sputtering, screening, stenciling, chemical including chemical vapor deposition (CVD), vacuum, and so forth.

The resulting IC package is flexible in terms of the orientation, size, number, order, and composition of its constituent elements. Various embodiments of the subject matter may be implemented using various combinations of substrate and component technologies, choice of materials, and fabrication operations, to achieve the advantages of the inventive subject matter. The structure, including types of materials used, dimensions, layout, geometry, and so forth, of the IC package may be built in a wide variety of embodiments, depending upon the requirements of the electronic assembly of which it forms a part.

FIGS. 1–7 are merely representational and are not drawn to scale. Certain proportions thereof may be exaggerated, while others may be minimized. FIGS. 1–9 are intended to illustrate various embodiments of the subject matter that can be understood and appropriately carried out by those of ordinary skill in the art.

The inventive subject matter provides for a substrate, an electronic package, an electronic assembly, and methods of manufacture thereof that may minimize packaging-caused mechanical stress problems associated with high performance IC's. Otherwise, the electronic package may experience stresses, such as inter-layer dielectric stresses, including cracking and/or delamination, and the associated electronic assembly may malfunction or even experience a catastrophic failure.

An electronic system and/or data processing system that incorporates one or more electronic assemblies that utilize an embodiment of the subject matter may reduce mechanical stresses associated with high performance IC's, and such systems may therefore be more commercially attractive than other systems.

Other embodiments will be readily apparent to those of ordinary skill in the art after reading this disclosure. The elements, materials, geometries, dimensions, and sequence of operations may all be varied to suit particular packaging requirements.

While certain operations have been described herein relative to "upper" and "lower" surfaces, it will be understood that these descriptors are relatives and that they would be reversed if the IC package were inverted. Therefore, these terms are not intended to be limiting.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the subject matter. Therefore, it is manifestly intended that embodiments of the subject matter be limited only by the claims and the equivalents thereof.

It is emphasized that the Abstract is provided to comply with 37 C.F.R. §1.72(b) requiring an Abstract that will allow the reader to ascertain the nature and gist of the technical disclosure. It is submitted with the understanding that it will not be used to interpret or limit the scope or meaning of the claims.

In the foregoing Detailed Description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. A substrate comprising:
    an upper surface upon which an electronic component having a lower surface is to be mounted at a distance, the electronic component comprising a plurality of relatively low yield strength, reflowable solder contacts;
    a plurality of conductors; and
    a plurality of relatively high yield strength columns projecting from the upper surface and coupled to selected ones of the plurality of conductors, the columns to physically couple to corresponding solder contacts of the electronic component through an operation in which the solder contacts are melted without melting the columns, wherein the columns have a height that is greater than 60% of the distance, and wherein the columns are surrounded by underfill between the electronic component lower surface and the substrate upper surface.

2. The substrate recited in claim 1, wherein the columns are formed of material having a higher melting temperature than the contacts.

3. The substrate recited in claim 1, wherein selected ones of the plurality of columns are substantially cylinders.

4. The substrate recited in claim 1, wherein selected ones of the plurality of columns are substantially truncated cones or substantially inverted truncated cones.

5. The substrate recited in claim 1, wherein selected ones of the plurality of columns are substantially truncated pyramids or substantially inverted truncated pyramids.

6. The substrate recited in claim 1, wherein the columns comprise material selected from the group consisting essentially of antimony, bismuth, copper, gallium, gold, indium, lead, nickel, silver, tin, zinc, or alloys thereof, and wherein the columns have a melting temperature at least 100 degrees Centigrade higher than a melting temperature of the contacts.

7. An integrated circuit package comprising:
    a die having a plurality of reflowable solder contacts on a surface thereof, selected contacts comprising a first material having a first melting temperature; and
    a substrate having a plurality of columns projecting from an upper surface thereof, selected columns comprising a second material having a second melting temperature higher than the first melting temperature, the selected columns being physically coupled to the selected contacts through an operation in which the selected contacts are melted without melting the selected columns, wherein the die surface is a distance from the substrate upper surface, and wherein the columns have a height that is greater than 60% of the distance.

8. The package recited in claim 7, wherein the first material has a lower yield strength than the second material.

9. The package recited in claim 7, wherein the selected contacts comprise a eutectic tin-lead solder.

10. The package recited in claim 7, wherein the selected contacts comprise lead-free solder.

11. The package recited in claim 7, wherein the selected contacts comprise material selected from the group consisting essentially of antimony, bismuth, copper, gallium, gold, indium, lead, nickel, silver, tin, zinc, or alloys thereof.

12. The package recited in claim 7, wherein the shape of the selected columns is selected from the group consisting of substantially a cylinder, substantially a truncated cone, substantially an inverted truncated cone, substantially a truncated pyramid, and substantially an inverted truncated pyramid.

13. The package recited in claim 7, the aspect ratio between the height and the diameter of the selected columns is in a range of 0.5 to 3.

14. The package recited in claim 7, wherein the aspect ratio between the height and the diameter of the selected columns is 3.

15. The package recited in claim 7, wherein the selected columns comprise material selected from the group consisting essentially of antimony, bismuth, copper, gallium, gold, indium, lead, nickel, silver, tin, zinc, or alloys thereof, and wherein the second melting temperature is at least 100 degrees Centigrade higher than the first melting temperature.

16. The package recited in claim 7, wherein the die comprises a dielectric substance having a dielectric constant less than 3.6.

17. The package recited in claim 7, wherein the die comprises a first dielectric substance and the substrate comprises a second dielectric substance, and wherein the first dielectric substance is more susceptible to fracture than the second dielectric substance.

18. The package recited in claim 17, wherein the first dielectric substance has a dielectric constant less than 3.6 and wherein the second dielectric substance comprises an organic dielectric material.

19. An electronic assembly comprising:
a die having a plurality of reflowable solder contacts on a surface thereof, the contacts comprising a first material having a first melting temperature;
a first substrate having
an upper surface and a lower surface;
a plurality of columns projecting from the upper surface thereof and physically coupled to corresponding ones of the plurality of contacts, the columns comprising a second material having a second melting temperature higher than the first melting temperature, wherein the die surface is a distance from the first substrate upper surface, and wherein the columns have a height that is greater than 60% of the distance, and
a plurality of pads on the lower surface thereof; and
a second substrate having a plurality of lands on a surface thereof, the lands being coupled to corresponding pads of the first substrate.

20. The electronic assembly recited in claim 19, wherein the first material has a lower yield strength than the second material.

21. The electronic assembly recited in claim 19, wherein the shape of selected ones of the plurality of columns is selected from the group consisting of substantially a cylinder, substantially a truncated cone, substantially an inverted truncated cone, substantially a truncated pyramid, and substantially an inverted truncated pyramid.

22. The electronic assembly recited in claim 19, wherein the second material is selected from the group consisting essentially of antimony, bismuth, copper, gallium, gold, indium, lead, nickel, silver, tin, zinc, or alloys thereof, and wherein the second melting temperature is at least 100 degrees Centigrade higher than the first melting temperature.

23. An electronic system comprising:
a bus coupling components in the electronic system;
a display coupled to the bus;
external memory coupled to the bus; and
a processor coupled to the bus and having an electronic assembly including at least one component package having
a die having a plurality of reflowable contacts on a surface thereof, selected contacts comprising a first material having a first melting temperature; and
a substrate having a plurality of columns projecting from an upper surface thereof, selected columns comprising a second material having a second melting temperature higher than the first melting temperature, the selected columns being physically coupled to the selected contacts through an operation in which the selected contacts are melted without melting the selected columns, wherein the die surface is a distance from the substrate upper surface, and wherein the columns have a height that is greater than 60% of the distance.

24. The electronic system recited in claim 23, wherein the first material has a lower yield strength than the second material.

25. The electronic system m claim 23, wherein the shape of the selected columns is selected from the group consisting of substantially a cylinder, substantially a truncated cone, substantially an inverted truncated cone, substantially a truncated pyramid, and substantially an inverted truncated pyramid.

26. The electronic system recited in claim 23, wherein the second material is selected from the group consisting essentially of antimony, bismuth, copper, gallium, gold, indium, lead, nickel, silver, tin, zinc, or alloys thereof, and wherein the second melting temperature is at least 100 degrees Centigrade higher than the first melting temperature.

27. An integrated circuit package comprising:
a die having a plurality of reflowable solder contacts on a surface thereof, selected contacts comprising a first material having a first melting temperature;
a substrate having a plurality of columns projecting from an upper surface thereof, selected columns comprising a second material having a second melting temperature higher than the first melting temperature, the selected columns being physically coupled to the selected contacts through an operation in which the selected contacts are melted without melting the selected columns; and
a layer of underfill of a thickness D between the die surface and the substrate upper surface;
wherein the columns have a height that is greater than 60% of the underfill thickness D.

28. The package recited in claim 27, wherein the first material has a lower yield strength than the second material.

29. The package recited in claim 27, wherein the selected contacts comprise a eutectic tin-lead solder.

30. The package recited in claim 27, wherein the selected contacts comprise lead-free solder.

31. The package recited in claim 27, wherein the selected contacts comprise material selected from the group consisting essentially of antimony, bismuth, copper, gallium, gold, indium, lead, nickel, silver, tin, zinc, or alloys thereof.

32. The package recited in claim 27, wherein the shape of the selected columns is selected from the group consisting of substantially a cylinder, substantially a truncated cone, substantially an inverted truncated cone, substantially a truncated pyramid, and substantially an inverted truncated pyramid.

33. The package recited in claim 27, wherein the aspect ratio between the height and the diameter of the selected columns is in a range of 0.5 to 3.

34. The package recited in claim 27, wherein the aspect ratio between the height and the diameter of the selected columns is 3.

35. The package recited in claim 27, wherein the selected columns comprise material selected from the group consisting essentially of antimony, bismuth, copper, gallium, gold, indium, lead, nickel, silver, tin, zinc, or alloys thereof, and wherein the second melting temperature is at least 100 degrees Centigrade higher than the first melting temperature.

36. The package recited in claim 27, wherein the die comprises a dielectric substance having a dielectric constant less than 3.6.

37. The package recited in claim 27, wherein the die comprises a first dielectric substance and the substrate comprises a second dielectric substance, and wherein the first dielectric substance is more susceptible to fracture than the second dielectric substance.

38. The package recited in claim 37, wherein the first dielectric substance has a dielectric constant less than 3.6, and wherein the second dielectric substance comprises an organic dielectric material.

* * * * *

UNITED STATES PATENT AND TRADEMARK OFFICE
CERTIFICATE OF CORRECTION

PATENT NO. : 6,989,586 B2
DATED : January 24, 2006
INVENTOR(S) : Agraharam et al.

It is certified that error appears in the above-identified patent and that said Letters Patent is hereby corrected as shown below:

<u>Title page,</u>
Item [74], *Attorney, Agent, or Firm,* delete "Lunberg," and insert -- Lundberg, --.

<u>Column 11,</u>
Line 24, after "7," insert -- wherein --.
Line 44, after "3.6" insert -- , --.

<u>Column 12,</u>
Line 38, after "system" delete "m" and insert -- recited in --.

Signed and Sealed this

Eighteenth Day of April, 2006

JON W. DUDAS
*Director of the United States Patent and Trademark Office*